(12) United States Patent
Yoon et al.

(10) Patent No.: US 11,680,311 B2
(45) Date of Patent: Jun. 20, 2023

(54) METHOD FOR PRODUCING AMORPHOUS THIN FILM

(71) Applicant: LG CHEM, LTD., Seoul (KR)

(72) Inventors: Jung Hwan Yoon, Daejeon (KR); Bu Gon Shin, Daejeon (KR); Jeong Ho Park, Daejeon (KR); Eun Kyu Her, Daejeon (KR); So Young Choo, Daejeon (KR); Yeon Jae Yoo, Daejeon (KR)

(73) Assignee: LG CHEM, LTD., Seoul (KR)

( * ) Notice: Subject to any disclaimer, the term of this patent is extended or adjusted under 35 U.S.C. 154(b) by 30 days.

(21) Appl. No.: 16/969,809

(22) PCT Filed: Jun. 11, 2019

(86) PCT No.: PCT/KR2019/006981
§ 371 (c)(1),
(2) Date: Aug. 13, 2020

(87) PCT Pub. No.: WO2019/240455
PCT Pub. Date: Dec. 19, 2019

(65) Prior Publication Data
US 2020/0370164 A1    Nov. 26, 2020

(30) Foreign Application Priority Data
Jun. 15, 2018  (KR) .................. 10-2018-0068864

(51) Int. Cl.
*C23C 14/58*    (2006.01)
*C23C 14/14*    (2006.01)
(Continued)

(52) U.S. Cl.
CPC ........ *C23C 14/5813* (2013.01); *B23K 26/082* (2015.10); *B23K 26/57* (2015.10);
(Continued)

(58) Field of Classification Search
CPC ..... C23C 14/185; C23C 14/14; C23C 14/005; C23C 14/25; C23C 14/58; C23C 14/34;
(Continued)

(56) References Cited

U.S. PATENT DOCUMENTS 4,970,196 A * 11/1990 Kim ................. C23C 14/048
427/586
7,927,454 B2 * 4/2011 Huynh ................. C23C 18/2086
156/308.4
(Continued)

FOREIGN PATENT DOCUMENTS

CN    105705671 A    6/2016
JP    S55-013945 A    1/1980
(Continued)

OTHER PUBLICATIONS

WO 2008126573 A1—Abstract (Year: 2008).*
(Continued)

*Primary Examiner* — Michael A Band
(74) *Attorney, Agent, or Firm* — Rothwell, Figg, Ernst & Manbeck, P.C.

(57) ABSTRACT

The present invention relates to a method for forming an amorphous layer on one surface of a second substrate through a simple method of performing laser irradiation on a multilayered metal layer provided on a first substrate.

12 Claims, 6 Drawing Sheets

(51) Int. Cl.

| | | |
|---|---|---|
| C23C 14/16 | (2006.01) | |
| C23C 14/18 | (2006.01) | |
| C23C 28/02 | (2006.01) | |
| C23C 26/02 | (2006.01) | |
| C03C 17/36 | (2006.01) | |
| B23K 26/082 | (2014.01) | |
| B23K 26/57 | (2014.01) | |
| C23C 14/34 | (2006.01) | |

(52) U.S. Cl.
CPC ...... *C03C 17/3639* (2013.01); *C03C 17/3649* (2013.01); *C23C 14/14* (2013.01); *C23C 14/165* (2013.01); *C23C 14/185* (2013.01); *C23C 14/34* (2013.01); *C23C 26/02* (2013.01); *C23C 28/02* (2013.01); *C03C 2218/154* (2013.01)

(58) Field of Classification Search
CPC ... C23C 14/5813; C23C 26/02; C23C 14/165; C23C 14/0005; C23C 28/02; C03C 17/3649; C03C 17/3639; C03C 2218/154; B23K 26/082; B23K 26/57
See application file for complete search history.

(56) References Cited

U.S. PATENT DOCUMENTS

| | | | | |
|---|---|---|---|---|
| 8,201,421 | B2* | 6/2012 | Komatsu | C03C 23/0025 65/392 |
| 8,912,549 | B2* | 12/2014 | Quick | G01J 5/58 257/77 |
| 2003/0148565 | A1 | 8/2003 | Yamanaka | |
| 2015/0294872 | A1 | 10/2015 | Molpeceres Alvarez et al. | |
| 2016/0233089 | A1* | 8/2016 | Zenou | H01G 7/026 |
| 2017/0210142 | A1 | 7/2017 | Kotler et al. | |

FOREIGN PATENT DOCUMENTS

| | | |
|---|---|---|
| JP | 05-065671 A | 3/1993 |
| JP | 2002-231628 A | 8/2002 |
| JP | 2013-082619 A | 5/2013 |
| JP | 2016-535817 A | 11/2016 |
| JP | 2017-530031 A | 10/2017 |
| KR | 10-1991-0009968 B1 | 12/1991 |
| KR | 10-2003-0093717 A | 12/2003 |
| KR | 10-2012-0102897 A | 9/2012 |
| KR | 10-2013-0026671 A | 3/2013 |
| KR | 10-2014-0099373 A | 8/2014 |
| KR | 10-2014-0114405 A | 9/2014 |
| KR | 10-2016-0070090 A | 6/2016 |
| KR | 10-2017-0032399 A | 3/2017 |
| KR | 10-2017-0097420 A | 8/2017 |
| WO | 2015-056253 A1 | 4/2015 |

OTHER PUBLICATIONS

Willis, D.; Grosu, V. "Microdroplet deposition by laser-induced forward transfer". Applied Physics Letters, 86, 2144103. (Year: 2005).*

EESR from European Patent Application No. 19818822.9 dated Mar. 24, 2021, 7 pages.

International Search Report and Written Opinion issued for International Application No. PCT/KR2019/006981 dated Sep. 19, 2019, 7 pages.

Ahn, Ji-soo et al. "Study on the Amorphization Reaction of the Co—Zr Multilayered Thin Film" Journal of The Korean Magnetics Society, Jun. 1996, vol. 6, No. 3, pp. 170-173.

* cited by examiner

EXAMPLE 1      COMPARATIVE EXAMPLE 1

METHOD FOR PRODUCING AMORPHOUS THIN FILM

CROSS-REFERENCE TO RELATED APPLICATION(S)

This application is a 35 U.S.C. 371 National Phase Entry Application from PCT/KR2019/006981 filed on Jun. 11, 2019, designating the United States, which claims the benefit of priority based on Korean Patent Application No. 10-2018-0068864 filed on Jun. 15, 2018, the disclosures of which are incorporated herein by reference in their entity.

TECHNICAL FIELD

The present invention relates to a method for producing an amorphous thin film capable of easily forming an amorphous layer by laser irradiation.

BACKGROUND ART

An amorphous metal theoretically means a metal that does not have a grain boundary. Further, in general, the amorphous metal may have microcrystallinity, but has a short-range order, so that there is an advantage in that it is possible to reduce a phenomenon in which fracture occurs from the grain boundary, which is a position where defects are generated, when external force is applied. That is, the amorphous metal has an aspect in which mechanical properties are excellent as compared to a pure metal or alloy having crystallinity.

In order to prepare an amorphous metal, generally, various metals of three more components are adjusted according to the composition, dissolved in a molten metal, and prepared as a bulk-type amorphous alloy. However, since each metal has a difference in melting temperature, it is difficult to uniformly control the composition in the melting process, thereby causing a problem in that a crystal phase is partially produced. The produced crystal phase is a main position where defects occur and becomes a starting point where cracks are generated by external force, thereby causing a problem in that the alloy is fractured by the cracks. In addition, since an amorphous alloy prepared by a method in the related art is not thick enough to be processed, there is a problem in that it is difficult to form the amorphous alloy in the form of a thin film.

Therefore, there is a need for a technique capable of manufacturing an amorphous thin film having a homogeneous composition.

BRIEF DESCRIPTION OF THE INVENTION

Thus, the present invention has been made in an effort to provide a method for producing an amorphous thin film capable of easily producing an amorphous layer.

However, a problem to be solved by the present invention is not limited to the aforementioned problem, and the other problems that are not mentioned may be clearly understood by a person skilled in the art from the following description.

An exemplary embodiment of the present invention provides a method for producing an amorphous thin film, the method including: forming a multilayered metal layer in which a first metal layer, a second metal layer, and a third metal layer are sequentially provided by sequentially depositing a first metal, a second metal, and a third metal on one surface of a first substrate; positioning one surface of a second substrate so as to face the one surface of the first substrate; and forming an amorphous layer including the first metal, the second metal, and the third metal on the one surface of the second substrate by irradiating the first substrate with a laser in a direction from the other surface to the one surface of the first substrate.

Advantageous Effects

The method for producing an amorphous thin film according to an exemplary embodiment of the present invention may form an amorphous layer on a second substrate by a simple method of irradiating a multilayered metal layer provided on a first substrate with a laser.

The effects of the present invention are not limited to the above-described effects, and effects, which are not mentioned, will be clearly understood by a person skilled in the art from the specification of the present application and the accompanying drawings.

DETAILED DESCRIPTION OF THE INVENTION

Throughout the specification of the present application, when one part "includes" one constituent element, unless otherwise specifically described, this does not mean that another constituent element is excluded, but means that another constituent element may be further included.

Throughout the specification of the present application, when one member is disposed "on" another member, this includes not only a case where the one member is brought into contact with another member, but also a case where still another member is present between the two members.

Throughout the specification of the present application, a term for a degree used, such as a "step . . . " or a "step of . . . ", does not mean a "step for . . . ".

Throughout the specification of the present application, the unit "wt %" means a weight ratio of a component included in a member based on the total weight of the member.

Throughout the specification of the present application, the unit "at %" means a percentage of the corresponding atom based on the total number of atoms included in a member.

Throughout the specification of the present application, the "light reflectance" means a ratio of the amount of light reflected from a member to the amount of light incident to the member. In this case, the amount of light incident to the member and the amount of light reflected from the member may be measured using a spectrophotometer (Lambda 950, PerkinElmer, Inc.).

Throughout the specification of the present application, the scanning speed of a laser means the speed at which the light source of the laser moves from one point on the surface of a member, which is irradiated with the laser, to the other point.

Throughout the specification of the present application, the spot size of a laser means the distance from one end to the other end of the region which is irradiated with the laser.

Throughout the specification of the present application, the pulse repetition rate of a laser means the frequency of the laser per second.

Hereinafter, the present specification will be described in more detail.

An exemplary embodiment of the present invention provides a method for producing an amorphous thin film, the method including: forming a multilayered metal layer in which a first metal layer, a second metal layer, and a third metal layer are sequentially provided by sequentially depositing a first metal, a second metal, and a third metal on one surface of a first substrate; positioning one surface of a second substrate so as to face the one surface of the first substrate; and forming an amorphous layer including the first metal, the second metal, and the third metal on the one surface of the second substrate by irradiating the first substrate with a laser in a direction from the other surface to the one surface of the first substrate.

The method for producing an amorphous thin film according to an exemplary embodiment of the present invention may form an amorphous layer on the second substrate by a simple method of irradiating the multilayered metal layer provided on the first substrate with the laser. Specifically, an amorphous layer may be easily transferred onto one surface of the second substrate by irradiating the multilayered metal layer having crystallinity with the laser.

Figure 1:
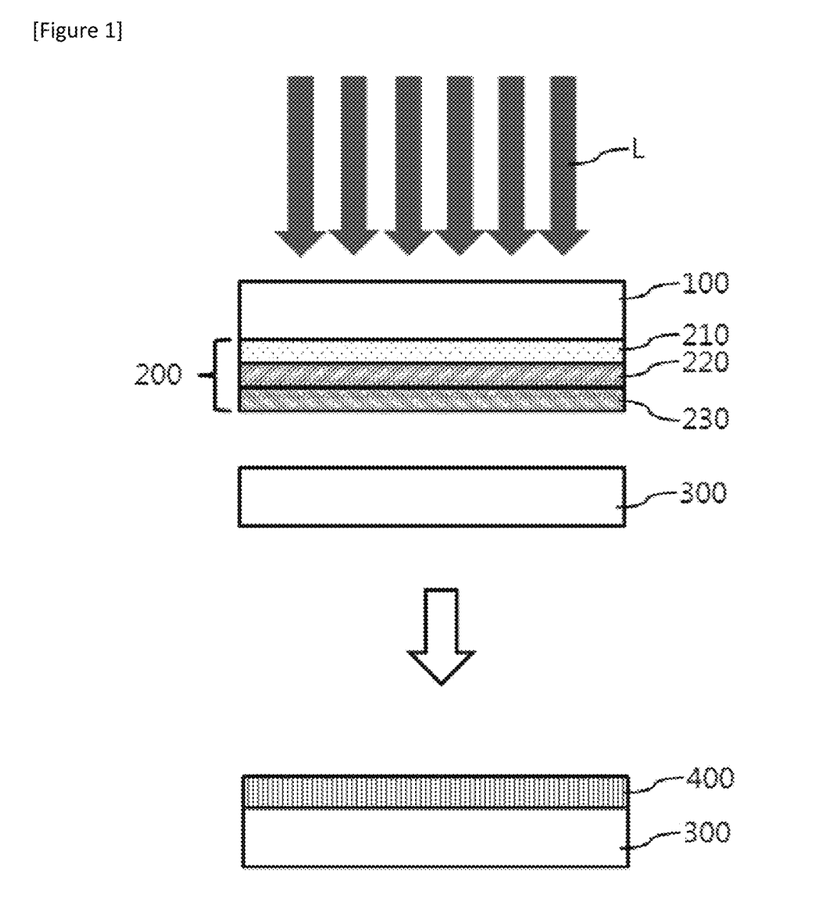
FIG. 1 is a view illustrating a process of producing an amorphous thin film according to an exemplary embodiment of the present invention.

FIG. 1 is a view illustrating a process of producing an amorphous thin film according to an exemplary embodiment of the present invention. Specifically, FIG. 1 illustrates that a multilayered metal layer 200 is formed in which a first metal layer 210, a second metal layer 220, and a third metal layer 230 are sequentially laminated on one surface of a first substrate 100 by sequentially depositing a first metal, a second metal, and a third metal on the one surface of the first substrate 100. Further, FIG. 1 illustrates that an amorphous layer 400 including a first metal, a second metal, and a third metal is transferred onto one surface of a second substrate 300 by irradiating the first substrate 100, having the multilayered metal layer 200 formed on the one surface thereof, with a laser L in a direction from the other surface to the one surface of the first substrate 100.

According to an exemplary embodiment of the present invention, the light reflectance of the first substrate may be 1% to 40%. Specifically, the first substrate may have a light reflectance of 1% to 40% with respect to light having a wavelength value of any one wavelength value of the wavelengths from 100 nm to 1,064 nm. More specifically, the light reflectance of the first substrate may be a light reflectance with respect to light having a wavelength value of 355 nm. The light reflectance of the first substrate may be, for example, a light reflectance of 30% with respect to light having a wavelength value of 355 nm. By using the first substrate having the light reflectance within the above-described range, the laser with which the first substrate is irradiated in a direction form the other surface to the one surface of the first substrate may effectively reach the multilayered metal layer.

According to an exemplary embodiment of the present invention, as the first substrate, any substrate may be used without limitation as long as the substrate has the above-described light reflectance. Specifically, as the first substrate, it is possible to use a substrate which facilitates the transmission of a laser beam in the wavelength range of the laser beam used to transfer a multilayered metal layer. For example, as the first substrate, it is possible to use a glass substrate, a polyethylene terephthalate (PET) substrate, a polyimide (PI) substrate, and the like, but the type of first substrate is not limited.

According to an exemplary embodiment of the present invention, the first substrate may have a thickness of 0.1 mm to 2.0 mm. For example, the substrate may have a thickness of 0.1 mm to 1.0 mm, or 1.0 mm to 2.0 mm. The laser with which the first substrate is irradiated may be effectively induced on the multilayered metal layer by adjusting the thickness of the first substrate within the above-described range. In addition, when the thickness of the first substrate is within the above-described range, the first substrate may be suppressed from being deformed by the laser. Accordingly, it is possible to prevent the laser process efficiency from deteriorating.

According to an exemplary embodiment of the present invention, any substrate used in the art may be used without limitation as the second substrate. Furthermore, the type of second substrate may be selected according to the purpose for which the second substrate provided with the amorphous layer is used. For example, when the amorphous layer is applied to a solar cell electrode, as the second substrate, it is possible to use a soda lime glass substrate, a ceramic substrate such as alumina and quartz, and a metal substrate such as stainless steel, chrome steel, titanium, ferrite steel, and molybdenum.

Further, the first substrate and the second substrate may be formed of the same material or different materials.

According to an exemplary embodiment of the present invention, the deposition of the metal may be performed by any one method of sputtering, an electron beam deposition method, a thermal deposition method, a plasma chemical vapor deposition method, and a low-pressure chemical vapor deposition method. That is, the deposition of the first metal, the second metal, and the third metal may be performed by any one method of sputtering, an electron beam deposition method, a thermal deposition method, a plasma chemical vapor deposition method, and a low-pressure chemical vapor deposition method. Specifically, it is possible to form a first metal layer, a second metal layer, and a third metal layer having a homogenous composition on one surface of the first substrate by using a sputtering method to sequentially deposit a first metal, a second metal, and a third metal on the one surface of the first substrate. Further, when the sputtering method is used, it is possible to easily adjust the thicknesses of the first metal layer, the second metal layer, and the third metal layer to be formed on the one surface of the first substrate by adjusting a sputtering power, an angle and a distance between a sputtering target and the first substrate, and the like.

According to an exemplary embodiment of the present invention, a light reflectance of the first metal layer may be smaller than the light reflectance of each of the second metal layer and the third metal layer. Specifically, with respect to light having any one wavelength value of the wavelengths from 100 nm to 1,064 nm, the light reflectance of the first metal layer may be smaller than the light reflectance of the second metal layer and the light reflectance of the third metal layer. More specifically, the light reflectance of each of the first metal layer, the second metal layer, and the third metal layer may be a light reflectance with respect to light having any one wavelength value of the wavelengths from 300 nm to 450 nm, and more specifically, may be a light reflectance with respect to light having a wavelength value of 355 nm.

Referring to FIG. 1, the first substrate 100 is irradiated with the laser L in a direction from the other surface to the one surface of the first substrate 100 and the laser L is brought into first contact with the first metal layer 210 in the multilayered metal layer 200. Thus, it is possible to effectively prevent the transfer efficiency from the multilayered metal layer to the amorphous layer from deteriorating by providing the first metal layer having the lowest light reflectance adjacent to the one surface of the first substrate. Specifically, the degree of reflection of the laser beam incident to the first metal layer having the lowest light reflectance is reduced by causing the laser to reach the first metal layer first, thereby preventing the laser process efficiency from deteriorating.

According to an exemplary embodiment of the present invention, the light reflectance of each of the first metal layer, the second metal layer, and the third metal layer may be measured by providing the first metal layer, the second metal layer, and the third metal layer on the first substrate. For example, it is possible to measure the light reflectance of a first laminate composed of the first substrate and the first metal layer provided on the first substrate. Further, it is possible to measure the light reflectance of a second laminate composed of the first substrate and the second metal layer provided on the first substrate, and to measure the light reflectance of a third laminate composed of the first substrate and the third metal layer provided on the first substrate.

According to an exemplary embodiment of the present invention, the laminate composed of the first metal layer and the first substrate may have a light reflectance of 45% or less. Specifically, the laminate composed of the first metal layer and the first substrate may have a light reflectance of 1% to 45%, 5% to 40%, 10% to 30%, 15% to 30%, 35% to 45%, 35% to 38%, 38% to 45%, or 38%. Further, the light reflectance of the laminate may be a reflectance with respect to light having any one wavelength value of the wavelengths from 100 nm to 1,064 nm, or the wavelengths from 300 nm to 450 nm. More specifically, the light reflectance of the laminate may be a light reflectance with respect to light having a wavelength value of 355 nm. When the light reflectance of the laminate composed of the first substrate and the first metal layer is within the above-described range, it is possible to effectively prevent the transfer efficiency from the multilayered metal layer to the amorphous layer from deteriorating.

According to an exemplary embodiment of the present invention, among the melting points of the first metal layer to the third metal layer, the difference between the highest melting point value and the lowest melting point value may be 200° C. to 500° C. Specifically, the difference in melting point between the metal layer having the highest melting point and the metal layer having the lowest melting point may be 400° C. to 450° C., 400° C. to 435° C., 435° C. to 450° C., 430° C. to 440° C., 280° C. to 450° C., 300° C. to 400° C., 200° C. to 270° C., or 310° C. to 470° C. When the difference between the highest melting point value and the lowest melting point value is within the above-described range among the melting points of the first metal layer to the third metal layer, the laser process efficiency may be improved. Specifically, by adjusting the difference between the highest melting point value and the lowest melting point value within the above-described range, it is possible to decrease the amount of energy for transferring the multilayered metal layer and to suppress a multilayered metal layer from being evaporated. Accordingly, it is possible to effectively prevent a crystal phase from being formed on an amorphous layer as the multilayered metal layer is rapidly evaporated and solidified.

In addition, the first metal layer may have the highest melting point, and the third metal layer may have the lowest melting point.

According to an exemplary embodiment of the present invention, the difference between the melting point of the first metal layer and the melting point of the second metal layer may be 10° C. to 100° C. For example, the difference may be 10° C. to 13° C. Furthermore, the difference between the melting point of the second metal layer and the melting point of the third metal layer may be 100° C. to 450° C. For example, the difference may be 100° C. to 422° C., or 422° C. to 450° C. The laser process efficiency may be effectively suppressed from deteriorating by adjusting the difference between the melting points of the metal layers within the above-described range.

Further, according to an exemplary embodiment of the present invention, the third metal layer may have a melting point of 500° C. to 900° C. For example, the melting point may be 500° C. to 650° C., 650° C. to 900° C., 600° C. to 650° C., or 650° C. to 700° C. The transfer efficiency of a multilayered metal layer may be improved by adjusting the melting point of the third metal layer within the above-described range. When the melting point of the third metal layer is within the above-described range, the third metal layer provided at a position where the laser reaches last may also be easily melted and thus transferred onto one surface of the second substrate.

According to an exemplary embodiment of the present invention, the atomic radii of the first metal, the second metal, and the third metal are different from one another. Further, the types of first metal, second metal, and third metal may be selected by considering the atomic radii of the first metal, the second metal, and the third metal so as to implement amorphous properties of the amorphous layer.

According to an exemplary embodiment of the present invention, the third metal may include at least one of magnesium, calcium, aluminum, and lanthanum. In addition, the first metal may include at least one of copper, yttrium, and silver. Furthermore, the second metal may include at least one of samarium and neodymium. However, the types of first metal, second metal, and third metal are not limited, and it is possible to select and use an appropriate metal element capable of implementing physical properties of the amorphous layer as the first metal to the third metal.

An amorphous layer may be formed on one surface of the second substrate by appropriately selecting the types of first metal, second metal, and third metal. For example, a multilayered metal layer may be produced by forming a first metal layer including copper on one surface of the first substrate, forming a second metal layer including samarium on the first metal layer, and forming a third metal layer including magnesium on the second metal layer, and an amorphous layer may be formed on one surface of the second substrate by irradiating the multilayered metal layer with the laser.

According to an exemplary embodiment of the present invention, the multilayered metal layer may have a thickness of 1.5 µm to 3.0 µm. Specifically, the multilayered metal layer may have a thickness of 1.7 µm to 2.8 µm, 2.0 µm to 2.5 µm, 1.5 µm to 1.8 µm, or 2.1 µm to 2.7 µm. An amorphous layer may be easily formed by adjusting the thickness of the multilayered metal layer within the above-described range to improve the transfer efficiency of the multilayered metal layer. Further, when the thickness of the multilayered metal layer is within the above-described range, the surface roughness of an amorphous layer to be formed on one surface of the second substrate may be effectively reduced, and the composition of the amorphous layer may be effectively homogenized.

According to an exemplary embodiment of the present invention, a multilayered metal layer provided on one surface of the first substrate may be transferred onto one surface of the second substrate by irradiating the first substrate, in which the multilayered metal layer formed on one surface thereof, with the laser in a direction from the other surface of the first substrate to the one surface of the first substrate, thereby forming an amorphous layer. Specifically, when the laser is incident to the multilayered metal layer, the multilayered metal layer is melted and thus transferred onto one surface of the second substrate, and as the metal layer is rapidly cooled, an amorphous layer may be formed on one surface of the second substrate.

According to an exemplary embodiment of the present invention, it is possible to suppress a large amount of evaporation generated during the process in which the multilayered metal layer is transferred, by adjusting the difference among the melting points of the first metal layer to the third metal layer and/or the thickness of the multilayered metal layer. Specifically, by suppressing the evaporation phenomenon, it is possible to prevent a crystal phase from being formed due to the composition imbalance of the amorphous layer. In addition, it is possible to suppress the transfer efficiency of the multilayered metal layer from deteriorating due to the evaporated component precipitated in the form of a powder on the second substrate as the evaporated component is rapidly cooled.

According to an exemplary embodiment of the present invention, a laser used in the art may be used, and specifically, a pulse laser may be used. More specifically, as the laser, a pulse laser with a wavelength of 355 nm may be used. In addition, the laser may have an output of 1 W/cm$^2$ to 10 W/cm$^2$. Specifically, the laser may have an output of 1.5 W/cm$^2$ to 8 W/cm$^2$, 1.5 W/cm$^2$ to 8 W/cm$^2$, 2 W/cm$^2$ to 6 W/cm$^2$, 2.5 W/cm$^2$ to 4.5 W/cm$^2$, 1 W/cm$^2$ to 2 W/cm$^2$, or 4 W/cm$^2$ to 8 W/cm$^2$. Energy may be stably transferred to the multilayered metal layer by adjusting the output of the laser within the above-described range.

According to an exemplary embodiment of the present invention, the laser irradiation may be performed at a scanning speed of 1 mm/sec to 20 mm/sec. Specifically, the laser irradiation may be performed at a scanning speed of 2 mm/sec to 18 mm/sec, 4.5 mm/sec to 15 mm/sec, 7 mm/sec to 12.5 mm/sec, 1.5 mm/sec to 5 mm/sec, 8 mm/sec to 13 mm/sec, or 15 mm/sec to 19 mm/sec, at an output of 2 W/cm$^2$. More specifically, the scanning speed of the laser may be 1 mm/sec to 5 mm/sec, 1.5 mm/sec to 4.5 mm/sec, 2.0 mm/sec to 3.5 mm/sec, 1.0 mm/sec to 2.5 mm/sec, 2.5 mm/sec to 5.0 mm/sec, 2.5 mm/sec to 10 mm/sec, 2.5 mm/sec to 20.0 mm/sec, 5.0 mm/sec to 10 mm/sec, 5.0 mm/sec to 20 mm/sec, or 3.0 mm/sec to 5.0 mm/sec. The crystallinity of the amorphous layer transferred onto one surface of the second substrate may be effectively reduced by adjusting the scanning speed of the laser within the above-described range.

According to an exemplary embodiment of the present invention, the laser may have a pulse repetition rate of 1 kHz to 40 kHz. Specifically, the laser may have a pulse repetition rate of 3 kHz to 35 kHz, 5 kHz to 30 kHz, 10 kHz to 20 kHz, or 13 kHz to 17 kHz. More specifically, the laser may have a pulse repetition rate of 25 kHz to 35 kHz, or 30 kHz to 40 kHz. For example, the laser may have a pulse repetition rate of 30 kHz. By adjusting the pulse repetition rate of the laser within the above-described range, it is possible to suppress the laser process efficiency from deteriorating due to the reduction in degree of superposition of the focused laser beam. Furthermore, when the pulse repetition rate of the laser is within the above-described range, it is possible to prevent the first substrate from being degraded by irradiation with excess energy.

According to an exemplary embodiment of the present invention, the laser irradiation may be performed with a spot size of 10 µm to 200 µm. Specifically, the laser irradiation may be performed with a spot size of 20 µm to 180 µm, 40 µm to 160 µm, or 70 µm to 120 µm. More specifically, the laser irradiation may be performed with a spot size of 15 µm to 40 µm, 20 µm to 30 µm, or 25 µm to 30 µm. For example, the spot size may be 25 µm. By adjusting the spot size of the laser within the above-described range, it is possible to suppress the first substrate from being thermally deformed by the laser. Further, when the spot size of the laser is within the above-described range, it is possible to suppress the laser process from becoming unstable due to the decrease in the superposition rate of the laser spot.

According to an exemplary embodiment of the present invention, the output, scanning speed, and pulse repetition rate of the laser interact with each other, and process conditions of the laser may be controlled by adjusting at least one of the output, scanning speed, and pulse repetition rate of the laser. Further, according to the object to be irradiated with laser, the object may also be irradiated by adjusting the output, scanning speed, pulse repetition rate, and spot size of the laser out of the above-described range.

According to an exemplary embodiment of the present invention, the amorphous layer may have a thickness of 0.01 µm to 3 µm. Specifically, the amorphous layer may have a thickness of 0.01 µm to 1.4 µm, 1.4 µm to 3.0 µm, 0.05 µm to 2.8 µm, 0.1 µm to 2.0 µm, 0.5 µm to 1.8 µm, 1.0 µm to 1.5 µm, 0.2 µm to 0.7 µm, 1.2 µm to 1.7 µm, or 2.1 µm to 2.5 µm. For example, the thickness may be 1.4 µm. The thickness of the amorphous layer may be controlled by adjusting the thickness of the multilayered metal layer, the output of the laser, and the like.

Accordingly, the method for producing an amorphous thin film according to an exemplary embodiment of the present invention may easily form an amorphous metal layer in the form of a thin film on one surface of the second substrate.

Hereinafter, the present invention will be described in detail with reference to Examples for specifically describing the present invention. However, the Examples according to the present invention may be modified in various forms, and it is not interpreted that the scope of the present invention is limited to the Examples to be described below. The Examples of the present specification are provided for more completely explaining the present invention to a person with ordinary skill in the art.

Example 1

As a first substrate, a glass substrate having a thickness of about 1 mm and a light reflectance of about 30% with respect to light having a wavelength value of 355 nm was prepared. Further, as a second substrate, a glass substrate having a thickness of about 1 mm was prepared. Thereafter, a first metal layer having a thickness of about 0.45 μm was formed on one surface of the first substrate by setting an output of a sputtering device at 250 W/cm² and sputtering a copper target at a DC 1 cathode of the sputtering device. Thereafter, a second metal layer having a thickness of about 0.15 μm was formed on the first metal layer by setting the output of the sputtering device at 25 W/cm² and sputtering samarium at an RF cathode of the sputtering device. Thereafter, a third metal layer having a thickness of about 0.90 μm was formed on the second metal layer by setting the output of the sputtering device at 300 W/cm² and sputtering a magnesium target at a DC 2 cathode of the sputtering device. Accordingly, a multilayered metal layer having a total thickness of about 1.5 μm was formed on one surface of the first substrate.

The second substrate was positioned so as to face the third metal layer. Thereafter, the first substrate was irradiated with a pulse laser having a wavelength of 355 nm, of which the output, the scanning speed, the spot size and the pulse repetition rate were set to 2 W/cm², 2.5 mm/sec, 25 μm and 30 kHz, respectively, in a direction from the other surface to one surface thereof. Accordingly, an amorphous layer having a thickness of about 1.4 μm was formed on one surface of the second substrate.

Example 2

An amorphous layer was formed in the same manner as in Example 1, except that the scanning speed of the laser was adjusted to 5 mm/sec.

Comparative Example 1

An amorphous layer was formed in the same manner as in Example 1, except that a first metal layer having a thickness of about 0.99 μm was formed on a first substrate by setting an output of a sputtering device at 125 W/cm² to sputter a copper target, a second metal layer having a thickness of about 0.33 μm was formed on the first metal layer by setting the output of the sputtering device at 50 W/cm² to sputter a samarium target, and a third metal layer having a thickness of about 1.98 μm was formed on the second metal layer by setting the output of the sputtering device at 250 W/cm² to sputter a magnesium target, thereby forming a multilayered metal layer having a total thickness of about 3.3 μm on one surface of the first substrate.

Reference Example 1

An amorphous layer was formed in the same manner as in Example 1, except that the scanning speed of the laser was adjusted to 20 mm/sec.

Reference Example 2

An amorphous layer was formed in the same manner as in Example 1, except that the scanning speed of the laser was adjusted to 10 mm/sec.

Evaluation of Physical Properties

The melting points of the first metal layer, the second metal layer, and the third metal layer produced in Example 1 were measured, and as a result, the melting point of the first metal layer was about 1,085° C., the melting point of the second metal layer was about 1,072° C., and the melting point of the third metal layer was about 650° C.

The light reflectance of each of the first metal layer, the second metal layer, and the third metal layer was measured as described below. A glass substrate having a thickness of about 1 mm and a light reflectance of about 30% with respect to light having a wavelength value of 355 nm was prepared, and a first metal layer having a thickness of about 0.45 μm on a glass substrate was formed by setting the output of the sputtering device at 250 W/cm², and sputtering a copper target at a DC 1 cathode of the sputtering device, thereby producing a first laminate. Further, a second metal layer having a thickness of about 0.15 μm was formed on another glass substrate by setting the output of the sputtering device at 25 W/cm² and sputtering samarium at an RF cathode of the sputtering device, thereby producing a second laminate. In addition, a third metal layer having a thickness of about 0.90 μm was formed on still another glass substrate by setting the output of the sputtering device at 300 W/cm² and sputtering a magnesium target at a DC 2 cathode of the sputtering device, thereby producing a third laminate.

Thereafter, the light reflectance of each of the first laminate, the second laminate, and the third laminate was measured using a spectrophotometer (Lambda 950, PerkinElmer Inc.).

Figure 2:
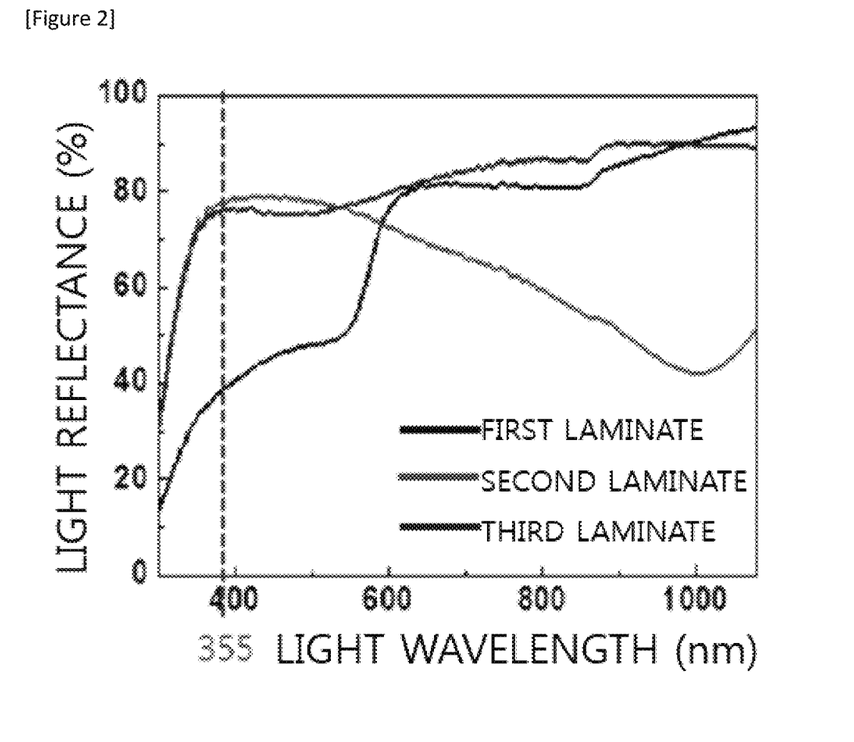
FIG. 2 is a view illustrating the light reflectance of each of a first laminate, a second laminate, and a third laminate according to an exemplary embodiment of the present invention.

FIG. 2 is a view illustrating the light reflectance of each of the first laminate, the second laminate, and the third laminate according to an exemplary embodiment of the present invention. Specifically, FIG. 2 illustrates the light reflectance of each of the first laminate composed of the first substrate and the first metal layer, the second laminate composed of the first substrate and the second metal layer, and the third laminate composed of the first substrate and the third metal layer.

Referring to FIG. 2, it was confirmed that the first laminate composed of the first substrate and the first metal layer had a light reflectance of about 38% with respect to light having a wavelength value of 355 nm. Furthermore, it was confirmed that the second laminate composed of the first substrate and the second metal layer had a light reflectance of about 78.5% with respect to light having a wavelength value of 355 nm and the third laminate composed of the first substrate and the third metal layer had a light reflectance of about 76% with respect to light having a wavelength value of 355 nm.

Observation of Surface of Amorphous Layer

The surfaces of the amorphous layers produced in Example 1 of the present invention and Comparative Example 1 were observed by a scanning electron microscope (SU8020, HITACHI, Ltd.), and the SEM photographs thereof were captured.

Figure 3:
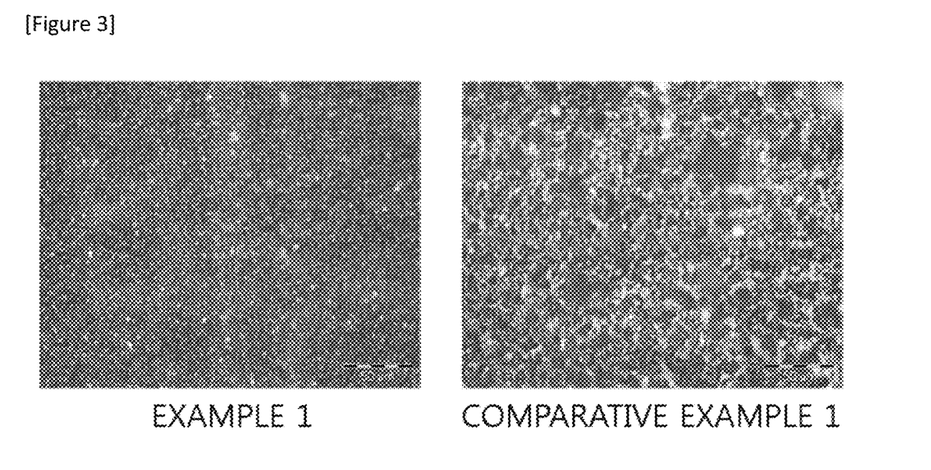
FIG. 3 is a set of scanning electron microscope (SEM) photographs of the surfaces of amorphous layers produced in Example 1 of the present invention and Comparative Example 1.

FIG. 3 is a set of scanning electron microscope (SEM) photographs of the surfaces of the amorphous layers produced in Example 1 of the present invention and Comparative Example 1. Referring to FIG. 3, it was confirmed that in the case of Example 1 in which the thickness of the multilayered metal layer was adjusted to about 1.5 μm, the surface of the amorphous layer formed as the multilayered metal layer was transferred was smooth, and the amorphous metal layer was formed with a homogenous composition on the surface. Meanwhile, it was confirmed that in the case of Comparative Example 1 in which the thickness of the multilayered metal layer was adjusted to about 3.3 μm, the surface of the amorphous layer was a little rough and the amorphous metal layer on the surface was not homogenous.

Accordingly, it can be seen that according to an exemplary embodiment of the present invention, by adjusting the thickness of the multilayered metal layer to 1.5 µm to 3.0 µm, the surface roughness of an amorphous layer to be formed can be reduced, and an amorphous layer having a homogenous composition can be formed.

Measurement of Physical Properties of Amorphous Layer

The amorphous layers produced in Examples 1 and 2 and Reference Examples 1 and 2 of the present invention were subjected to X-ray diffraction spectroscopy (XRD) analysis using an X-ray diffraction analyzer (D4 endeavor, Bruker Corporation).

Figure 4A:
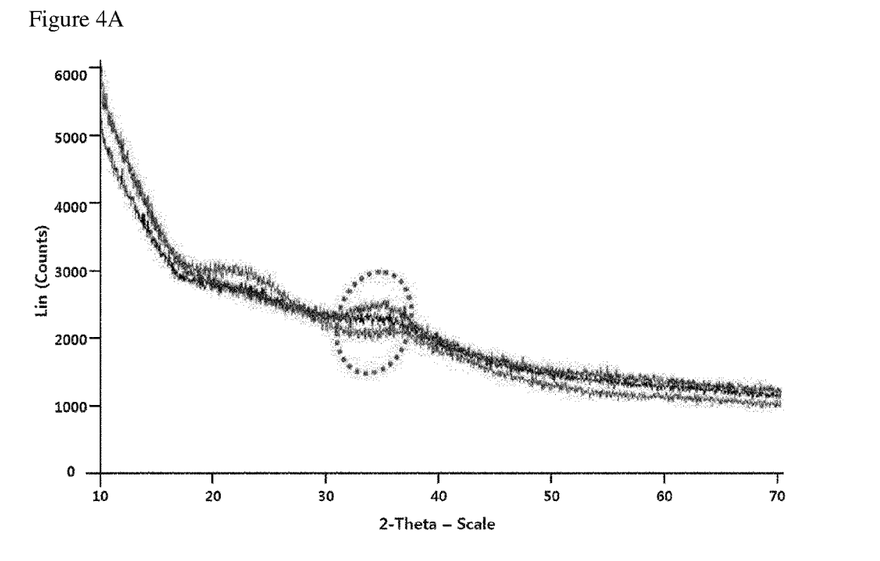
FIG. 4A is a view illustrating X-ray diffraction spectroscopy (XRD) analysis results of the amorphous layer produced in Example 1 of the present invention.
Figure 4B:
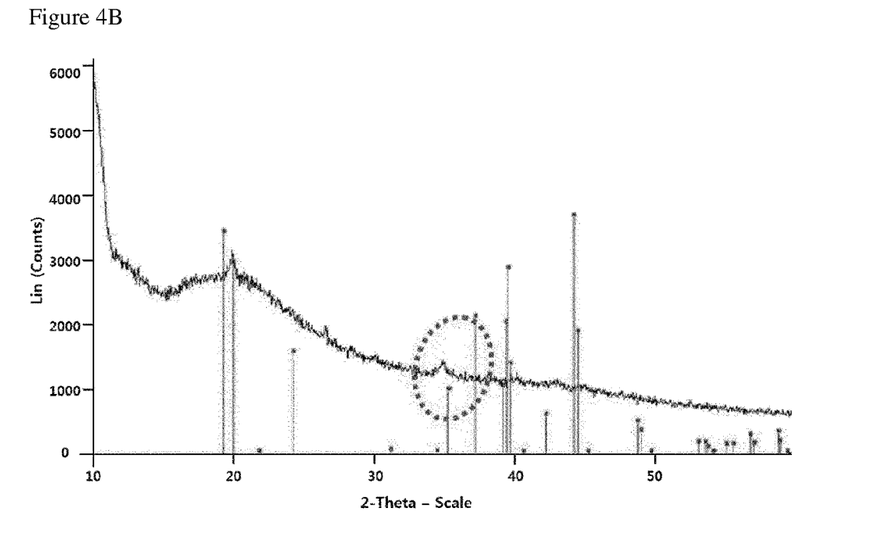
FIG. 4B is a view illustrating XRD analysis results of the amorphous layer produced in Example 2 of the present invention.
Figure 4C:
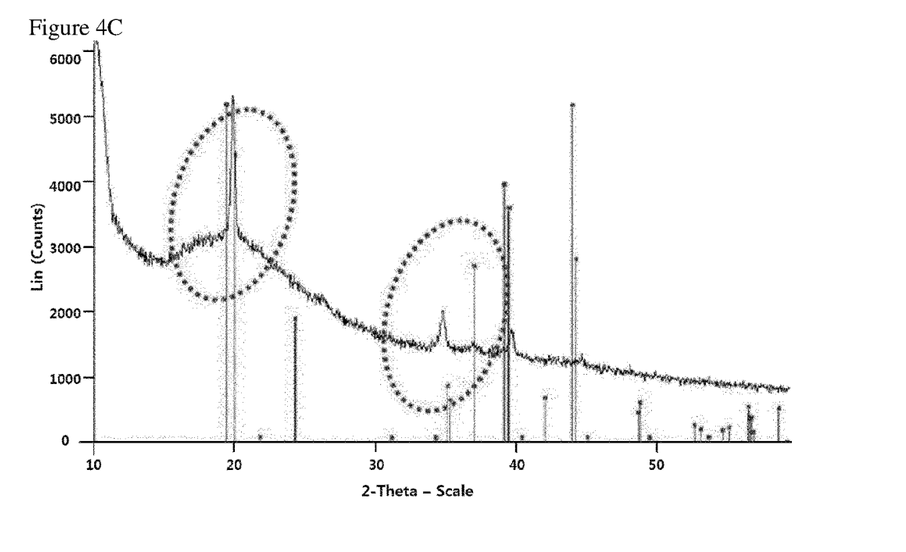
FIG. 4C is a view illustrating XRD analysis results of the amorphous layer produced in Reference Example 1 of the present invention.
Figure 4D:
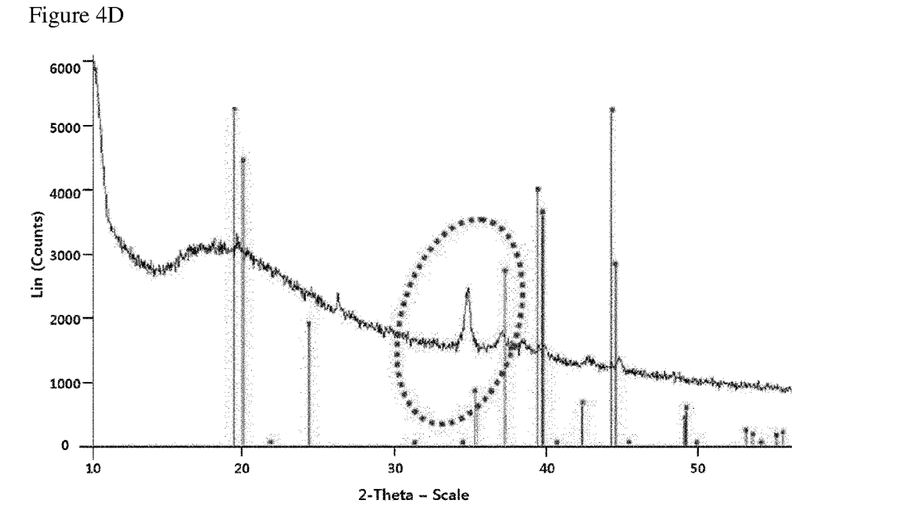
FIG. 4D is a view illustrating XRD analysis results of the amorphous layer produced in Reference Example 2 of the present invention.
Figure 4E:
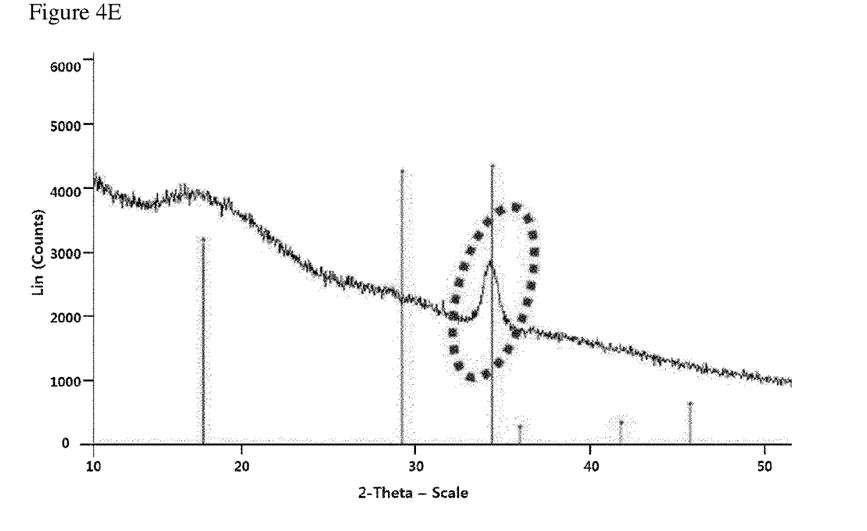
FIG. 4E is a view illustrating XRD analysis results of the multilayered metal layer produced in Example 1 of the present invention.

FIG. 4A is a view illustrating X-ray diffraction spectroscopy (XRD) analysis results of the amorphous layer produced in Example 1 of the present invention, FIG. 4B is a view illustrating XRD analysis results of the amorphous layer produced in Example 2 of the present invention, FIG. 4C is a view illustrating XRD analysis results of the amorphous layer produced in Reference Example 1 of the present invention, FIG. 4D is a view illustrating XRD analysis results of the amorphous layer produced in Reference Example 2 of the present invention, and FIG. 4E is a view illustrating XRD analysis results of the multilayered metal layer produced in Example 1 of the present invention.

Referring to FIG. 4E, it was confirmed that in the multilayered metal layer produced in Example 1 of the present invention, a peak exhibiting crystallinity was present. Meanwhile, referring to FIGS. 4A and 4B, it was confirmed that in the case of Example 1 in which the scanning speed of the laser was adjusted to 2.5 mm/sec and Example 2 in which the scanning speed of the laser was adjusted to 5 mm/sec, the height of the peak exhibiting crystallinity was very low. That is, it was confirmed that through Examples 1 and 2, the amorphous layers having amorphous properties could be produced from the multilayered metal layer having crystallinity.

Meanwhile, it was confirmed that in the case of Reference Example 1 in which the scanning speed of the laser was adjusted to 20 mm/sec and Reference Example 2 in which the scanning speed of the laser was adjusted to 10 mm/sec, peaks exhibiting crystallinity somewhat appeared. Furthermore, it was confirmed that in the case of Example 1, a peak exhibiting crystallinity rarely appeared as compared to Example 2.

Further, the contents of magnesium, copper, and samarium, which are included in the multilayered metal layer produced in Example 1 of the present invention and the amorphous layer produced in Example 1 and obtained through the XRD analysis, are shown in the following Table 1.

TABLE 1

|  | Mg (at %) | Cu (at %) | Sm (at %) |
| --- | --- | --- | --- |
| Example 1 (Multilayered metal layer) | 84.07 | 15.02 | 0.91 |
| Example 1 (Amorphous layer) | 60 | 30 | 10 |

Figure 5:
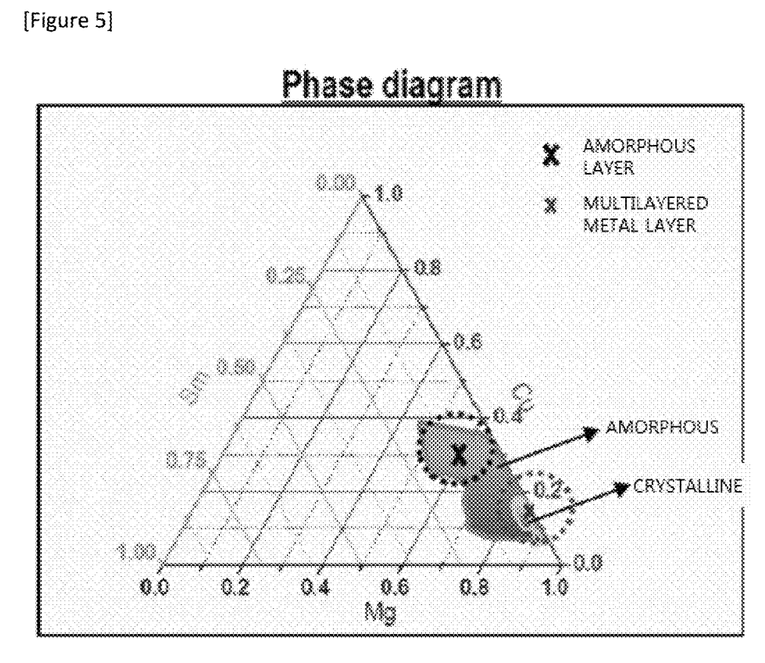
FIG. 5 is a phase diagram illustrating the composition ranges of the multilayered metal layer and the amorphous layer produced in Example 1 of the present invention.

FIG. 5 is a phase diagram illustrating the composition ranges of the multilayered metal layer and the amorphous layer produced in Example 1 of the present invention. Specifically, FIG. 5 illustrates a phase diagram of the three elements of magnesium, copper, and samarium, and is a view illustrating an amorphous region and a crystalline region according to the contents of magnesium, copper, and samarium. More specifically, FIG. 5 is a view illustrating that the composition of the multilayered metal layer produced in Example 1 of the present invention is included in the crystalline region, and the composition of the amorphous layer is included in the amorphous region.

Referring to Table 1 and FIG. 5, it was confirmed that the multilayered metal layer formed in Example 1 of the present invention had crystallinity, but the amorphous metal layer formed on one surface of the second substrate was in the amorphous form.

Therefore, according to an exemplary embodiment of the present invention, it can be seen that through a simple method of irradiating the multilayered metal layer having crystallinity with the laser, the amorphous metal layer can be formed on one surface of the second substrate. In addition, it can be seen that the crystallinity of the amorphous layer transferred onto one surface of the second substrate can be effectively reduced by adjusting the scanning speed of the laser with which the multilayered metal layer is irradiated.

EXPLANATION OF REFERENCE NUMERALS AND SYMBOLS

100: First substrate
200: Multilayered metal layer
210: First metal layer
220: Second metal layer
230: Third metal layer
300: Second substrate
400: Amorphous layer

The invention claimed is:

1. A method for producing an amorphous thin film, the method comprising:
    forming on a first substrate a multilayered metal layer by sequentially depositing a first metal layer comprising a first metal, a second metal layer comprising a second metal, and a third metal layer comprising a third metal by sequentially depositing a first metal, a second metal, and a third metal on one surface of the first substrate;
    providing one surface of a second substrate to face the multilayered metal layer; and
    forming an amorphous layer comprising the first metal, the second metal, and the third metal on the one surface of the second substrate by irradiating the other surface of the first substrate with a laser in a direction from the other surface to the one surface of the first substrate,
    wherein the first metal layer includes at least one metal selected from copper and silver, the second metal layer includes at least one metal of samarium and neodymium and the third metal includes at least one metal selected from magnesium, calcium, aluminum, and lanthanum,
    wherein the multilayered metal layer has a thickness of 1.5 µm to 3.0 µm,
    wherein a difference between the melting point of the first metal layer and the melting point of the second metal layer is 10° C. to 100° C., and a difference between the melting point of the second metal layer and the melting point of the third metal layer is 100° C. to 450° C.,
    wherein the depositing of the multilayered metal layer is performed by sputtering, and
    wherein the laser irradiation is performed at a scanning speed of 4.5 mm/sec to 20 mm/sec.

2. The method of claim 1, wherein a light reflectance of the first metal layer is smaller than a light reflectance of each of the second metal layer and the third metal layer.

3. The method of claim 1, wherein a laminate composed of the first metal layer and the first substrate has a light reflectance of 45% or less with respect to light having a wavelength value of any one wavelength value of the wavelengths from 100 nm to 1,064 nm.

4. The method of claim 1, wherein among the melting points of the first metal layer to the third metal layer, a difference between the highest melting point value and the lowest melting point value is 200° C. to 500° C.

5. The method of claim 1, wherein the laser irradiation is performed at an output of 1 W/cm$^2$ to 10 W/cm$^2$.

6. The method of claim 1, wherein the laser irradiation is performed at a scanning speed of 4.5 mm/sec to 15 mm/sec.

7. The method of claim 1, wherein the laser irradiation is performed with a spot size of 10 μm to 200 μm.

8. The method of claim 1, wherein the laser has a pulse repetition rate of 1 kHz to 40 kHz.

9. The method of claim 1, wherein the amorphous layer has a thickness of 0.01 μm to 3 μm.

10. The method of claim 1, wherein the first substrate has a thickness of 0.1 mm to 2.0 mm.

11. The method of claim 1, wherein the first substrate is at least one substrate selected from a glass substrate, a polyethylene terephthalate (PET) substrate, and a polyimide (PI) substrate.

12. The method of claim 1, wherein a light reflectance of the first substrate is a light reflectance of 1% to 40% with respect to light having a wavelength value of 355 nm.

* * * * *